(12) United States Patent
Friddell

(10) Patent No.: US 7,376,882 B2
(45) Date of Patent: May 20, 2008

(54) ADAPTABLE CHANNEL COMPENSATION FOR RELIABLE COMMUNICATION OVER FADING COMMUNICATION LINKS

(75) Inventor: Thomas H Friddell, Kent, WA (US)

(73) Assignee: The Boeing Company, Chicago, IL (US)

( * ) Notice: Subject to any disclaimer, the term of this patent is extended or adjusted under 35 U.S.C. 154(b) by 530 days.

(21) Appl. No.: 11/106,093

(22) Filed: Apr. 14, 2005

(65) Prior Publication Data
US 2006/0236192 A1    Oct. 19, 2006

(51) Int. Cl.
*H03M 13/00* (2006.01)

(52) U.S. Cl. .................. 714/755; 714/761; 714/788; 714/787; 714/786; 714/762; 714/779; 714/795; 714/784; 375/341; 375/262

(58) Field of Classification Search ............. 714/755, 714/786, 787, 788, 761, 701, 779, 762, 759, 714/784, 756, 795; 375/341, 262; 702/9
See application file for complete search history.

(56) References Cited

U.S. PATENT DOCUMENTS

| | | | |
|---|---|---|---|
| 5,241,563 A | 8/1993 | Paik et al. | |
| 5,519,734 A | 5/1996 | Ben-Efraim | |
| 5,699,365 A * | 12/1997 | Klayman et al. | ........... 714/708 |
| 5,719,875 A | 2/1998 | Wei | |
| 5,764,649 A | 6/1998 | Tong | |
| 5,771,239 A | 6/1998 | Moroney et al. | |
| 5,852,614 A | 12/1998 | Stephens et al. | |
| 5,889,791 A | 3/1999 | Yang | |
| 6,003,147 A | 12/1999 | Stephens et al. | |
| 6,035,427 A | 3/2000 | Kweon | |
| 6,055,277 A | 4/2000 | Stephens et al. | |
| 6,064,664 A | 5/2000 | Kim | |
| 6,122,295 A | 9/2000 | Kato et al. | |
| 6,233,712 B1 | 5/2001 | Rhee et al. | |
| 6,304,609 B1 | 10/2001 | Stephens et al. | |
| 6,334,197 B1 * | 12/2001 | Eroz et al. | ................... 714/701 |

(Continued)

OTHER PUBLICATIONS

Communications Research Centre, Canada, "Interleaver Technology", 3 pgs, Aug. 26, 2004.
Wikipedia, "Reed-Solomon Error Correction", 3 pgs, Sep. 15, 2004.

(Continued)

*Primary Examiner*—Guy J. Lamarre
(74) *Attorney, Agent, or Firm*—Harness, Dickey & Pierce, P.L.C.

(57) ABSTRACT

A method for reducing fading channel signal data loss for serial data rates up to approximately 10 gigabits per second includes sequentially distributing serial data to multiple encoders. Individual data bytes are sent from the encoders to a convolutional interleaver. Each byte is distributed to an individual memory element of the interleaver in a received byte sequence. An address generator generates write and read addresses assignable to each memory element. Multiple shift registers have variably graduated lengths. The serial data is distributed between channels each having a different delay element created by shift register length differences. The delay elements are adjustable to correct data dropout due to daily atmospheric/channel changes. Fade detection signals are inserted before transmission and measured at a receiver. The fade signals help create erasure bits to improve decoding accuracy and adjust interleaver delay parameters.

28 Claims, 2 Drawing Sheets

U.S. PATENT DOCUMENTS

| | | |
|---|---|---|
| 6,480,521 B1 | 11/2002 | Odenwalder et al. |
| 6,697,993 B1 | 2/2004 | Lopez |
| 7,269,208 B2 * | 9/2007 | Mazzoni et al. ............ 375/219 |
| 2002/0146074 A1 * | 10/2002 | Ariel et al. ............ 375/240.27 |
| 2006/0156173 A1 * | 7/2006 | Deczky ...................... 714/755 |

OTHER PUBLICATIONS

4i2i Communications Ltd, "Reed-Solomon Codes, An Introduction to Reed-Solomon Codes: Principles, Architecture and Implementation", 8 pgs, Sep. 30, 2004.

* cited by examiner

ADAPTABLE CHANNEL COMPENSATION FOR RELIABLE COMMUNICATION OVER FADING COMMUNICATION LINKS

FIELD OF THE INVENTION

The present invention relates in general to communication system error correction and more specifically to a communication system and method for correcting large volume data rate drop outs which can occur at high data transmission rates.

BACKGROUND OF THE INVENTION

Communication systems, such as for earth-satellite communication, present a need for an extremely high-speed, reliable and difficult to intercept communication link. Known communication systems lose data due to signal fade or atmospheric turbulence. Optical links through the atmosphere using limited sized apertures are subject to short-term drop-outs due to atmospheric turbulence. At desirable transmission rates of up to approximately 10 gigabits per second (Gbps) even short drop-outs cause the loss of large volumes of data. For the 10 Gbps example, 50 million bits of data are lost in a 5 ms dropout. Dropout characteristics can also be asymmetrical, such that drop-out is worse for an uplink than for a downlink.

To help prevent data loss, standard forward error correction (FEC) coding techniques such as Reed-Solomon or Turbo codes or a concatenation of Reed-Solomon with Viterbi coding are employed. Reed-Solomon coding works by constructing a polynomial from the data symbols to be transmitted. The redundant data allows the reconstruction of the original polynomial even with transmission errors or drop-outs of data. Reed-Solomon and other known coding techniques work well to eliminate short bursts of drop-out data, but become ineffective when encountering large bursts of errors, such as a drop-out that involves an extremely large number of bits. For example, forward error correction (FEC) gain achieving a $10_{-10}$ bit error rate (BER) at the output with a $10^{-6}$ BER from the receiver, having a 5 ms drop-out in the exemplary 10 Gbps link, would require a 1.4 hour block length (50 trillion bits) for the BER within the block to be $10^{-6}$. Use of known block interleavers to achieve this spacing would result in an unacceptably high transport delay, making the link unusable.

SUMMARY OF THE INVENTION

According to a preferred embodiment of the present invention an adaptable channel compensation for reliable communication over fading communication links includes a serial data communication system having a convolutional interleaver and a de-interleaver, the de-interleaver being an inverted version of the interleaver. Each interleaver and de-interleaver includes a plurality of variable depth shift registers constructed using random access read/write memory (RAM) banks. A plurality of parallel address generators each connectable to one of the random access memory banks converts the RAM into shift registers. An address generator algorithm is also included having a variable delay element addressing scheme. The algorithm is operable to allow the delay element to vary in length.

According to another aspect of the invention, a variable depth convolutional interleaver data transfer system includes a plurality of encoders configured in parallel with each other. A variable depth convolutional interleaver is operable to receive serial data from the encoders. A variable depth convolutional de-interleaver is operable to receive serial data from the convolutional interleaver. Pluralities of individual memory banks are disposed in each of the interleaver and the de-interleaver. Address generators are each assignable to interleaver RAM and de-interleaver RAM. Pluralities of decoders are configured in parallel with each other, the decoders being operable to decode the serial data received from the de-interleaver. An address generator algorithm includes a variable delay element portion. The algorithm is operable to both insert a delay element into a serial data stream through the address generators and vary a length of the delay element.

According to still another aspect of the present invention, a method for reducing signal data loss includes a process for arranging a plurality of encoders in parallel with each other. A next process includes sequentially distributing serial data to each of the encoders. Another process includes sending individual bytes of the distributed serial data from the encoders to a convolutional interleaver. A next process includes distributing each byte to an individual memory bank of the interleaver in a received sequence of the bytes. A following process includes generating write and read addresses using an individual address generator assignable to each memory bank. Yet another process includes creating a plurality of shift registers having variable graduated lengths. Still yet another process includes distributing the serial data between a plurality of channels each having a different delay element operably created by differences in the shift register lengths. A final process includes generating erasure bits to assist the parallel decoders in determining data corrections.

According to still yet another aspect of the present invention, a method for reducing signal data loss over a fading communication link further includes detecting a signal drop-out in at least one of the channels.

An adaptable channel compensation system of the present invention offers several advantages. A combination of elements including Reed-Solomon codes, erasure bits, parallel processing and a convolutional interleaver maximizes coding and minimizes the requirements on adjacent bit spacing needed to achieve the coding, making reliable communication possible with achievable memory sizes even in the presence of typical data fades. Use of Reed-Solomon codes handle burst errors, allowing groups of symbols to be faulty and still corrected. The use of erasure bits doubles the error correction capability, which eases adjacent bit spacing requirements. The use of parallel processing allows operation using off-the-shelf parts for coding and memory addressing. The use of a convolutional interleaver halves the transport delay and memory requirements. The use of a variable-depth interleaver allows a reduced transport delay to be imposed while still achieving the required coding gain.

The features, functions, and advantages can be achieved independently in various embodiments of the present invention or may be combined in yet other embodiments.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiments is merely exemplary in nature and is in no way intended to limit the invention, its application, or uses.

Figure 1:
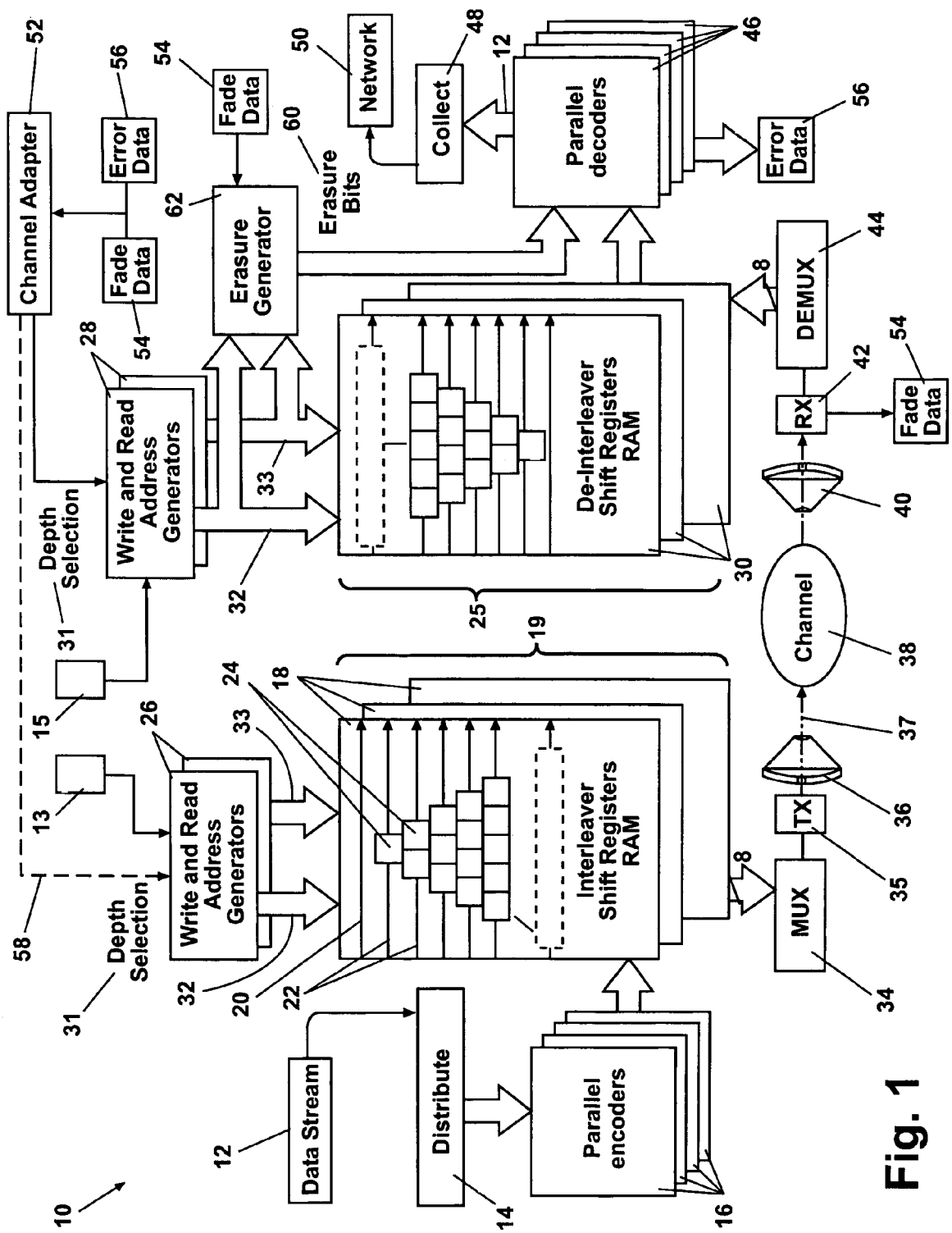
FIG. 1 is a flow diagram identifying an adaptable channel compensation system for reliable communication at ten gigabits per second over fading communication links according to a preferred embodiment of the present invention.

Referring generally to FIG. 1 and according to a preferred embodiment of the present invention, an adaptable channel compensation system 10 includes a data stream 12 for a communication link which is operable at up to approximately 10 gigabits per second. Data stream 12 enters a de-multiplexer 14 which distributes the data bits of data stream 12 into a plurality of encoders 16. De-multiplexer 14 contains a small amount of first-in-first-out memory equal to, or larger in size than, the number of bits in a fade detection sequence to be described later. This memory allows bits from data stream 12 to be buffered while the fade detection sequence is transmitted. Encoders 16 are arranged in parallel to each other and are configurable as either Reed Solomon encoders, turbo code encoders, or a Reed-Solomon encoder in combination with a Viterbi encoder. It is intended, although not required, that encoders 16 may be selected from standard or commercially available encoders whose quantity will vary depending upon the processing capability of the encoders and the total data input rate of data stream 12. Output from each of the encoders 16 is distributed into a plurality of convolutional interleaver memory elements or memory banks 18, the aggregate of which is referred to as convolutional interleaver 19. It is intended, although not required, that convolutional interleaver 19 may be implemented using standard or commercially available RAM, the number of which depends on the access speed of the read/write memory (RAM).

Convolutional interleaver 19 includes a non-delayed data path 20 and a plurality of delayed data paths 22. Delayed data paths 22 are sequentially delayed from each other and non-delayed data path 20 by each including an increasing quantity of memory/delay blocks 24 each of which can be created from a plurality of memory/delay elements. Asymmetrically changing the delay element(s) further allows for adapting for daily variations in an atmospheric environment of the communication link. A convolutional de-interleaver 25 is created similar to convolutional interleaver 19. Convolutional interleaver 19 functions by spreading apart individual bits over periods of time via each of the channels or delayed data paths 22. The delaying operation of delayed data paths 22 is implemented using the hardware logic configuration of two address generators 26 and 28 using an algorithm 13 associated with address generator 26, and an algorithm 15 associated with address generator 28 to implement the variable delay elements. In one embodiment of the present invention each address generator 26 and 28 includes a plurality of parallel address computation units each of which are connected to one of the memory banks 18 for convolutional interleaver 19 and to one of a plurality of memory elements or memory banks 30 of convolutional de-interleaver 25.

The aggregate of memory banks 30 is referred to as convolutional de-interleaver 25. In another embodiment, address generators 26 and 28 are implemented using pipelined operations and the addresses from address generator 26 are distributed simultaneously in parallel to all of the memory banks 18 and the addresses from address generator 28 are distributed simultaneously in parallel to de-interleaver memory banks 30. The address generators 26, 28 have an interleaver depth selection 31 as an input parameter, which in one aspect of the present invention determines the number of memory delay elements that form each memory/delay block 24. A plurality of write addresses 32 include memory bank selection that is generated sequentially in ascending order until it reaches the highest address available and then it recycles back to address zero. Sequentially adjacent writes to convolutional interleaver 19 are directed to different memory banks 18 so that writing to RAM never accesses the same memory bank on two adjacent writes. A plurality of read addresses 33 include memory bank selection and implement the shift register function. The read and write address schemes are synchronized so they never access the same memory bank 18 at the same time. In addition, pre-fetch and buffering is used to avoid reading two sequentially adjacent bytes from the same memory bank.

The output from each memory bank 18 of convolutional interleaver 19 is collected in a multiplexer 34. Multiplexer 34 combines all the data bits into a single bit stream which is then forwarded to a transmitter 35. From transmitter 35 the data stream is forwarded to a transmitter device 36. In one preferred embodiment of the present invention, transmitter device 36 is an optical telescope. From transmitter device 36, the data stream is forwarded as a single bit stream 37 via a channel/transmission path 38 to a receiver device 40. In one aspect of the present invention, channel/transmission path 38 is the Earth's atmosphere. In other aspects of the present invention, channel/transmission path 38 is space or water. Fluctuations in a variety of conditions including thermal heating can affect the overall transmission of bit stream 37 via channel/transmission path 38. Similar to transmitter device 36, receiver device 40 in one aspect of the present invention is an optical telescope.

Once the bit stream 37 is received by receiver device 40, it is forwarded to a receiver 42. From receiver 42 the bit stream is transferred to a de-multiplexer 44. De-multiplexer 44 functions similar to de-multiplexer 14 to distribute portions of bit stream 37 to individual ones of the plurality of convolutional de-interleaver memory banks 30. The convolutional de-interleaver 25 is a substantially inverted version of convolutional interleaver 19. The output from convolutional de-interleaver 25 is forwarded to a plurality of decoders 46 which act opposite to encoders 16 to reconstruct data stream 12. From decoders 46, data stream 12 is forwarded to a multiplexer 48 which functions similar to multiplexer 34. Multiplexer 48 combines the individual bit streams for forwarding to a network 50. Network 50 can be any user device positioned either on a mobile platform, or a ground based or a sea based system.

The method of adaptation will be understood from the following description. Atmospheric conditions vary according to weather conditions. This variation changes the duration and frequency of fading of bit stream 37 energy transmitted through channel/transmission path 38. In order to reconstruct the data that was transmitted when the signal is lost due to fading, longer duration fades require more separation between transmitted bits of bit stream 37 that are adjacent in data stream 12. Since greater separation between bits lengthens the delay between data stream 12 arriving at the input to the system and the same data being available to network 50, this invention causes the depth to be shortened and lengthened according to the delay that is required to achieve a specified bit error rate. Adaptable channel compensation system 10 adapts to these conditions by varying the amount of separation between bits in the transmitted bit stream 37 that are adjacent in data stream 12. This is done by varying the interleaver depth with the depth selection 31.

A channel adapter 52 determines the depth that is required to cause adequate bit separation. The depth is based on statistics of a plurality of fade signals 54 and a plurality of error signals 56 that are provided by receiver 42 and decoders 46. The resulting depth selection 31 and the time at which the selection is to be made is communicated to the transmitting system through any one of a plurality of available links 58 that can be either a radio frequency link or another optical link and can be a much lower speed link. The method of synchronizing interleaver depth selection is not specified as part of this invention.

In one embodiment of this invention fade signal 54 can be derived from bit stream 37 itself. In another embodiment of this invention fade signal 54 is derived by periodically inserting a short sequence of a number of symbols into the data path at multiplexer 34. This signal is referred to as a "fade detection sequence". The frequency of repetition of fade detection sequences is contrived to be short in comparison to the frequency and duration of channel fading but very long in comparison to the data stream bit rate of channel/transmission path 38. The fade signal 54 is true when all bits in the fade detection sequence are lost. The number of symbols transmitted is contrived to be such that the error rate for a false fade indication based on uncorrelated symbol errors is much less than the link error rate and failure to indicate a fade signal in the presence of highly correlated fading channel dropouts is also low. The transmitted symbols are designed to allow the receiver to measure signal strength. In one embodiment of the fade detection scheme that uses the fade detection sequence a non-return-to zero binary signal is transmitted for each symbol transmitted and the fade signal consists of several laser-on bits corresponding to a bit value of "1" and a fade signal is indicated if, and only if, all bits in the fade detection sequence received at receiver 42 are "0".

Two methods for generation of a plurality of erasure bits 60 based on fade signal 54 are described. The first method (not shown) places fade bits of fade signal 54 in a de-interleaver, referred to as an "erasure de-interleaver", being identical to de-interleaver 25. When this method is used, an erasure generator 62 is not implemented because erasure bits 60 are read out of the erasure de-interleaver. This method requires a large amount of memory. A more memory-efficient approach takes advantage of the difference between the time scales of the symbol transmission rate across channel/transmission path 38 and the fading rates of that channel. Therefore, in this method, a smaller memory is used in which addresses are stored and erasure bits are derived for blocks of data by table lookup.

Figure 2:
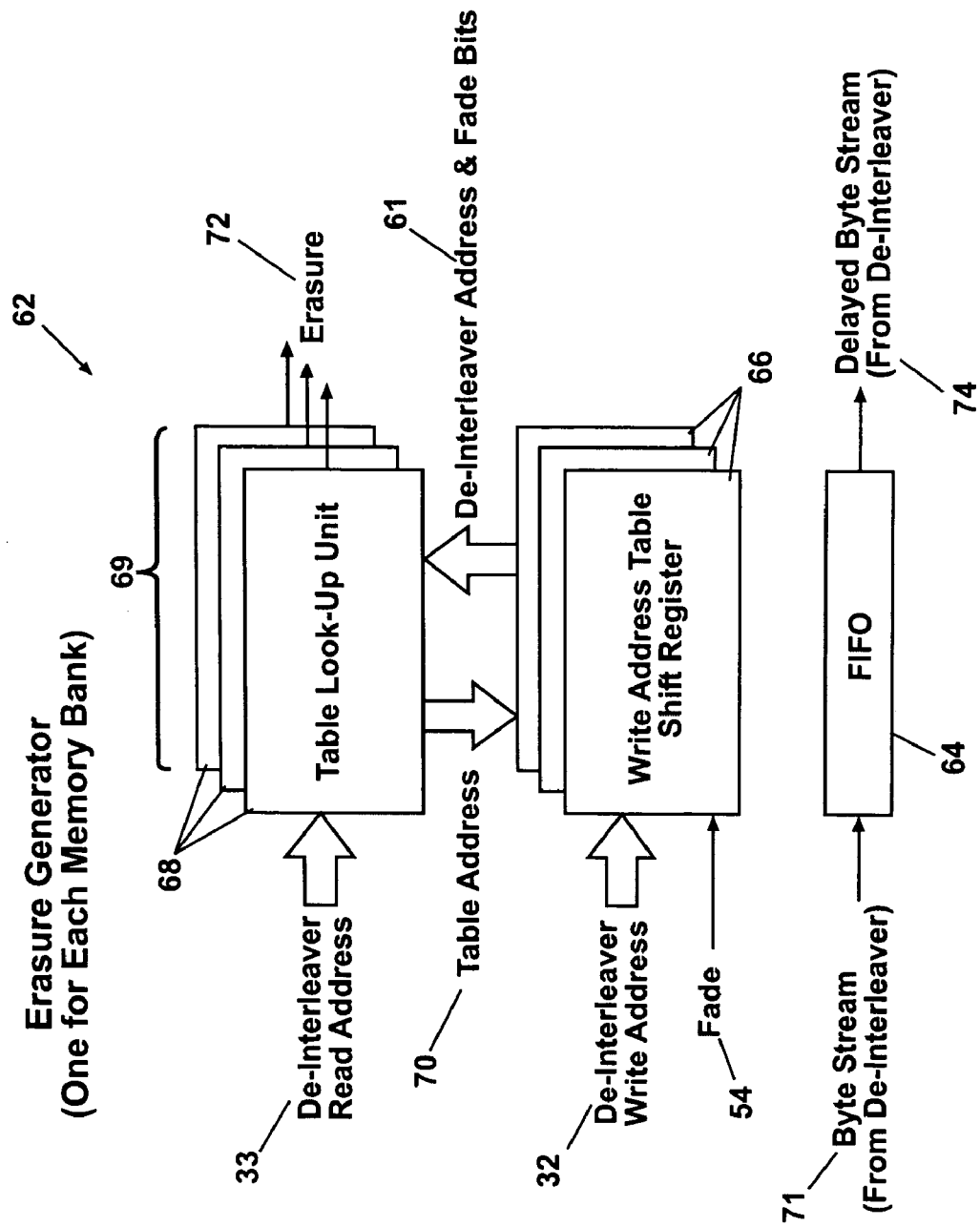
FIG. 2 is a flow diagram identifying the implementation of an erasure generator according to a preferred embodiment of the present invention.

Referring next to FIG. 2, the operation of one preferred embodiment of erasure generator 62 provides that each byte of data read from de-interleaver 25 and entering decoders 46 includes an accompanying erasure bit that is determined as follows. As each byte enters de-interleaver 25 from de-mulitplexer 44, fade signal 54 is tested by erasure generator 62 having a first-in-first-out buffer 64 that serves to provide processing time needed to compute the erasure bits, a plurality of Write Address Table Shift Registers 66, and a plurality of Table Lookup Units 68 creating a Table Lookup Unit 69. Each Write Address Table Shift Register 66 has one of the corresponding Table Lookup Units 68 and corresponds to one of the parallel decoders 46. As each time fade signal 54 changes from false to true a channel fade is considered to have begun. As each time fade signal 54 changes from true to false a signal fade is considered to have ended. At the beginning of a fade and at the end of a fade the current memory generator write address 32 connected to de-interleaver 25 and erasure generator 62, is stored simultaneously in each of a plurality of table shift registers 66. An indication of address generator cycle start, defined as a write address equal to "0", is also stored in table shift registers 66 in the form of a write address cycle ID. The fade signal state is also stored in each of these three events. Since data from more than one cycle can simultaneously exist in de-interleaver 25, the write address cycle ID is indicated using more than one bit. The table look-up unit 69 uses a binary search method to look up the correct erasure value in write address table shift registers 66 by supplying a table address 70 and comparing a de-interleaver write address 61 and its accompanying write address cycle ID stored at that location to the read address 33 of the de-interleaver, and the read address cycle serial number included with the read address 33 signals to de-interleaver 25. Once located, a current data stream 71 fade status is derived from the fade bit stored in write address table shift registers 66 from the next earlier event stored therein to determine the erasure status for that byte, which is set equal to the value of the fade bit of this same earlier event. An erasure signal 72 is produced for the byte currently being read out in a byte stream 74.

Adaptable channel compensation system 10 is capable of transmitting data at approximately 10 gigabits per second with sufficient gain to provide an end-to-end BER of approximately $10^{-10}$. An adaptable channel compensation system of the present invention offers several advantages. A combination of elements including Reed-Solomon codecs, use of erasure bits, parallel processing and a convolutional interleaving maximizes coding gain and minimizes the requirements on adjacent bit spacing needed to eliminate channel fading errors, making reliable communication possible with achievable memory sizes even in the presence of typical data fades. Use of Reed-Solomon codecs handle burst errors allowing groups of symbols to be faulty and still corrected. The use of erasure bits doubles the error correction capability, which eases adjacent bit spacing requirements. The use of parallel processing allows operation using off-the-shelf parts for coding and memory addressing. The use of a convolutional interleaver halves the transport delay and memory requirements. The use of a variable-depth interleaver allows the shortest possible transport delay to be imposed while still achieving the desired coding gain.

While various preferred embodiments have been described, those skilled in the art will recognize modifications or variations which might be made without departing from the inventive concept. The examples illustrate the invention and are not intended to limit it. Therefore, the description and claims should be interpreted liberally with only such limitation as is necessary in view of the pertinent prior art.

What is claimed is:

1. A serial data communication system, comprising:
   at least one convolutional interleaver having a first orientation;
   at least one convolutional de-interleaver having a second orientation, the second orientation being inverted from the first orientation;
   each interleaver and each de-interleaver further including:
      a plurality of variable depth shift registers;
      a plurality of random access memory elements configurable in sequential order and operable to provide memory storage for the variable depth shift registers; and a plurality of address generators each connectable to one of the random access memory elements and functional to operate the random access memory elements as a series of variable length shift registers; and an address generator algorithm having a variable delay element portion;

wherein the algorithm is operable to both insert a plurality of delay elements into a serial data stream through the address generators and vary a length of each delay element.

2. The system of claim 1, further comprising a plurality of encoders configured in parallel with each other and each connectable to one of the convolutional interleaver memory elements.

3. The system of claim 2, further comprising a plurality of decoders configured in parallel with each other and each connectable to one of the convolutional de-interleaver memory elements.

4. The system of claim 3, further comprising first and second de-multiplexers, the first de-multiplexer connectable to an input of each of the encoders and capable of buffering short sequences of an input data and the second de-multiplexer connectable to an input of the convolutional de-interleaver and capable of removing a plurality of fade detection signals.

5. The system of claim 4, further comprising first and second multiplexers, the first multiplexer connectable to the convolutional interleaver and capable of inserting the fade detection signals and the second multiplexer connectable to each of the decoders.

6. The system of claim 3, wherein each of the plurality of encoders and each of the plurality of decoders comprise Reed-Solomon devices.

7. The system of claim 3, wherein each of the plurality of encoders and each of the plurality of decoders comprise turbo code devices.

8. The system of claim 3, wherein each of the plurality of encoders and each of the plurality of decoders comprise a concatenation of Reed-Solomon devices with Viterbi coding and decoding devices.

9. The system of claim 1, further comprising a serial data transfer rate up to approximately 10 gigabits per second.

10. The system of claim 1, wherein the plurality of address generators further comprise a pipelined address generator.

11. A variable depth convolutional interleaver data transfer system, comprising:
a plurality of encoders;
a plurality of variable depth convolutional interleaver memory elements operable to receive a serial data from the encoders;
a plurality of variable depth convolutional de-interleaver memory elements operable to receive the serial data from the convolutional interleaver;
a plurality of individual address generators each assignable to one of the memory elements;
a plurality of decoders operable to decode the serial data received from the de-interleaver using a plurality of erasure indications;
a channel adapter capable of determining a plurality of delay durations based on a plurality of fade signals and error data;
an address generator algorithm having a variable delay element portion wherein the algorithm is operable to both insert a delay element into the serial data through the address generators and vary a length of the delay element; and an erasure generator operable to determine a quality of each bit from one of the plurality of fade signals and a data stream.

12. The transfer system of claim 11, comprising a transmitting device operable to wirelessly transmit an output of an interleaver.

13. The transfer system of claim 12, wherein the transmitting device comprises an optical device.

14. The transfer system of claim 12, further comprising a receiving device operable to receive an output of the interleaver transmitted by the transmitting device.

15. The transfer system of claim 14, wherein the receiving device comprises an optical device.

16. The transfer system of claim 11, wherein each of the plurality of encoders and each of the plurality of decoders comprise a Reed-Solomon device.

17. The transfer system of claim 11, wherein each of the plurality of encoders and each of the plurality of decoders comprise a turbo code device.

18. The transfer system of claim 11, wherein each of the plurality of encoders and each of the plurality of decoders comprise a Reed-Solomon device concatenated with Viterbi coding and decoding devices.

19. A method for reducing signal data loss, comprising:
arranging a plurality of encoders in parallel with each other;
sequentially distributing portions of a serial data stream to each of the encoders;
sending individual bytes of the distributed serial data from the encoders to individual ones of a plurality of convolutional interleaver memory elements;
generating write and read addresses using an individual address generator assignable to each memory element;
creating a plurality of shift registers having variable graduated lengths;
distributing the serial data between a plurality of channels each having a different delay element operably created by differences between a length of each shift register;
adjusting the delay element in at least one of the channels; and
inserting at least one fade detection signal into the serial data stream.

20. The method of claim 19, further comprising routing the serial data stream through a multiplexer after the creating process.

21. The method of claim 20, further comprising transmitting the serial data stream using a first optical device.

22. The method of claim 21, further comprising:
receiving the serial data stream using a second optical device;
measuring a plurality of data stream signal fades;
removing fade detection signals from the serial data stream;
de-multiplexing the serial data stream in a de-multiplexer;
distributing the de-multiplexed serial data stream to each of a plurality of convolutional de-interleaver memory elements;
generating a plurality of erasure indications from the fade detection signal; and
decoding the received signals using the plurality of erasure indications.

23. The method of claim 19, further comprising configuring a plurality of decoders in parallel with each other.

24. The method of claim 19, further comprising synchronizing the write and read addresses to prevent simultaneously accessing any one of the memory elements by two successive read operations to the same memory element.

25. The method of claim 19, further comprising synchronizing the write and read addresses to prevent simultaneously accessing any one of the memory elements by two successive write operations to the same memory element.

26. The method of claim 19, further comprising synchronizing the write and read addresses to prevent simultaneously accessing any one of the memory elements by simultaneously reading and writing to a same location.

27. The method of claim 19, further comprising routing the serial data stream through a de-multiplexer prior to the distributing step.

28. The method of claim 19, further comprising distributing the serial data stream at rate up to approximately 10 gigabits per second.

\* \* \* \* \*